(12) United States Patent
Hubert et al.

(10) Patent No.: US 10,979,177 B2
(45) Date of Patent: Apr. 13, 2021

(54) METHOD FOR IDENTIFYING DATA CORRUPTION IN A DATA TRANSFER OVER AN ERROR-PROOF COMMUNICATION LINK

(71) Applicant: Siemens Aktiengesellschaft, Munich (DE)

(72) Inventors: Johannes Hubert, Burgthann (DE); Marcus Lorentschk, Fürth (DE); Thomas Markus Meyer, Nuremberg (DE); Ales Gjerkes, Crensovci (SI); Nico Michaelis, Fürth (DE); Christoph Scherr, Heiligen Kreuz am Waasen (AT); Reinhard Watzenig, St. Stefan ob Stainz (AT)

(73) Assignee: Siemens Aktiengesellschaft, Munich (DE)

( * ) Notice: Subject to any disclaimer, the term of this patent is extended or adjusted under 35 U.S.C. 154(b) by 11 days.

(21) Appl. No.: 16/374,941

(22) Filed: Apr. 4, 2019

(65) Prior Publication Data
US 2019/0312677 A1    Oct. 10, 2019

(30) Foreign Application Priority Data
Apr. 5, 2018    (EP) .................... 18165818

(51) Int. Cl.
*H04L 1/00* (2006.01)
*H03M 13/09* (2006.01)
(Continued)

(52) U.S. Cl.
CPC .......... *H04L 1/0061* (2013.01); *H03M 13/09* (2013.01); *H03M 13/096* (2013.01); *H04L 69/22* (2013.01);
(Continued)

(58) Field of Classification Search
CPC ............ H04L 1/0061; H04L 12/40071; H04L 1/1874; H04L 47/34; H04L 69/22;
(Continued)

(56) References Cited

U.S. PATENT DOCUMENTS

| 2002/0087716 A1* | 7/2002 | Mustafa | ................ H04L 47/34 709/236 |
| 2004/0098655 A1* | 5/2004 | Sharma | ............... H03M 13/091 714/758 |

(Continued)

FOREIGN PATENT DOCUMENTS

| EP | 2814193 | 6/2013 |
| EP | 2634129 | 9/2013 |

OTHER PUBLICATIONS

PROFIBUS—PROFINET: "PROFisafe Systembeschreibung, Technologie and Anwendung", Profibus Nutzerorganisation E V PNO ED—Profibus Nutzerorganisation E V PNO, Internet Citation, pp. 1-26, XP002657152, Gefunden im Internet:URL:http://www.profibus.com/nc/downloads/d RECHERCHIERTEownloads/profisafe-technology-and-application-system-description/downloads/9595, [gefunden am Aug. 18, 2011], section 4.1; 2010.
(Continued)

*Primary Examiner* — April Y Blair
*Assistant Examiner* — Sazzad Hossain
(74) *Attorney, Agent, or Firm* — Cozen O'Connor

(57) ABSTRACT

System and method for identifying data corruption in a data transfer over an error-proof communication link, wherein additional structure checksums are formed to secure a data structure during transfer of the data structure, where representatives are associated with the data types, and the structure checksum is formed via the representatives to provide identification of data corruption in a data transfer over an error-proof communication link between a first automation component and a second automation component in industrial control engineering.

10 Claims, 4 Drawing Sheets

(51) Int. Cl.
   *H04L 29/06* (2006.01)
   *G06F 11/10* (2006.01)
   *H04W 16/14* (2009.01)
   *H04W 72/12* (2009.01)
   *H04W 72/04* (2009.01)
   *H04W 48/12* (2009.01)
   *H04W 74/08* (2009.01)
   *H04L 5/00* (2006.01)

(52) U.S. Cl.
   CPC ........ *G06F 11/1004* (2013.01); *H04L 1/0009* (2013.01); *H04L 5/0098* (2013.01); *H04W 16/14* (2013.01); *H04W 48/12* (2013.01); *H04W 72/042* (2013.01); *H04W 72/044* (2013.01); *H04W 72/0446* (2013.01); *H04W 72/0453* (2013.01); *H04W 72/1289* (2013.01); *H04W 74/0833* (2013.01)

(58) Field of Classification Search
   CPC ... H04W 28/04; H03M 13/091; H03M 13/09; H03M 13/096
   See application file for complete search history.

(56) References Cited

U.S. PATENT DOCUMENTS

| 2005/0259670 | A1* | 11/2005 | Anderson | H04L 29/06027 370/401 |
| 2005/0273689 | A1* | 12/2005 | Barthel | H04L 1/0061 714/758 |
| 2007/0074091 | A1* | 3/2007 | Go | H03M 13/096 714/752 |
| 2007/0186134 | A1* | 8/2007 | Singh | H04L 1/1614 714/749 |

OTHER PUBLICATIONS

PROFIBUS—PROFINET: "PROFIsafe—Profile for Safety Technology on PROFIBUS DP and PROFINET IO", IEC 61784-3-3 Ed. 3; Technical Specification, Version 2.6.1, Order No. 3.192, pp. 126; 2014.

IEC: "Industrial communication networks—Profiles—Part 3-12: Functional safety fieldbuses—Additional specifications for CPF 12", IEC 61784-3-12:2010, IEC 3, Rue De Varembe, PO Box 131, CH-1211 Geneva 20, Switzerland, pp. 1-203, XP082006973, [gefunden am Jun. 29, 2010], section 7; 2010.

* cited by examiner

FIG 1

| Data type | Representation |
|---|---|
| 21 — Bool | 17 |
| 22 — Int | 89 |
| 23 — DInt | 47 |
| 24 — Word | 91 |
| 25 — DWord | 50 |

20

| Example composition of data structure "A" | Representation of A | Example of checksum |
|---|---|---|
| Bool | 17 | |
| Int | 89 | 0x11223344 |
| Bool | 17 | |
| Int | 89 | |

| Example composition of data structure "B" | Representation of B | Example of checksum |
|---|---|---|
| Int | 89 | |
| Bool | 17 | 0x59425945 |
| Bool | 17 | |
| Int | 89 | |

| Example composition of data structure "C" | Representation of C | Example of checksum |
|---|---|---|
| Int | 89 | |
| Word | 91 | 0x9A693BF8 |
| DInt | 47 | |
| DWord | 50 | |

30

METHOD FOR IDENTIFYING DATA CORRUPTION IN A DATA TRANSFER OVER AN ERROR-PROOF COMMUNICATION LINK

BACKGROUND OF THE INVENTION

1. Field of the Invention

The invention relates to a method for identifying data corruption in a data transfer over an error-proof communication link between a first automation component and a second automation component in industrial control engineering, where, during transfer of a data structure, in order to secure the data structure in a telegram to be transferred, a checksum of the telegram is formed both at the first automation component and at the second automation component, wherein the data structure includes different data types.

The invention relates to the technical field of error-proof communication, which among other things is used in communication between field devices, control components and similar equipment in industrial process automation or production automation. Error-proof communication of this kind is also called F-communication, in particular in safety-relevant applications, in particular if errors in communication may result in a risk to persons, animals or property.

2. Description of the Related Art

In the prior art, for the purpose of error-proof communication in the above-mentioned technical fields, a specially secured packet-switching data transfer is used, in particular the Profisafe protocol.

EP 2 814 193 B1 discloses a method for identifying errors during the transfer of data from a transmitter to at least one receiver.

Profisafe standard V2.6.1 of PNO standard 2014 describes, on page 81, starting at line 1999, how data structures are secured using a checksum. When there is communication between error-proof controllers or with error-proof I/O modules, separate error analyses have to be performed in the error-proof environment. These error analyses particularly relate to ensuring that the desired communication partner has been addressed correctly and that the configuration is also suitable for both communication partners. This relates among other things to the data structure of the two communication partners. If an error occurs here, these errors must be reliably identified, and error-proof communication must adopt a secure condition. For example, if an error is identified, the receiver that has identified the error may supply substitute values and output them to the process.

Profisafe standard V2.6.1 already discusses all the error analyses, but it is disadvantageous that if errors arise in a data structure they cannot be reliably identified.

SUMMARY OF THE INVENTION

In view of the foregoing, it is therefore an object of the invention to provide a method that makes it possible to find a data transfer error in which a receiver and a transmitter have different data structures.

This and other objects and advantages are achieved in accordance with the invention by a method for identifying data corruption in which, before the checksum for the telegram is formed at the first automation component, a data-specific representative is associated with the data types contained in the data structure, and in which, by way of the one representative, a structure checksum is then formed, and the data structure with the structure checksum that is formed by way of the representatives is subsequently transferred, where within the second automation component the data-specific representative is once again associated by way of with the data types in the received data structure, and a new structure checksum is once again formed by way of the representatives, the transferred and the newly calculated structure checksum are checked at the second automation component and, in the event of a discrepancy between the structure checksums, data corruption is identified.

In the context of the invention, a representative should be regarded in mathematical terms, and is accordingly an element of a particular type. The relevant advantage here is that an earlier undiscovered switch of data types within the data structure can now be identified.

In an advantageous embodiment of the method, in the event of identification of data corruption, a data transfer error in the communication link is identified, and a secure condition is selected for the communication link, where pre-projected substitute values are provided in the second automation component.

In order to incorporate a cyclic structure checksum for the data structure within the normal telegram, it is advantageous if, during data transfer, the structure checksum that is formed by way of the representatives is transferred in addition to a checksum formed by way of the telegram to be transferred.

It is advantageous if there is used as the representative a numerical indicator, a textual indicator or indeed the data type indicator.

For the purpose of data transfer, a security protocol, in particular the Profisafe protocol, is preferably used.

It is particularly advantageous if the data structures according to the Object Linking and Embedding for Process Control Unified Architecture (OPC UA) specification are selected as the data structures.

It is also an object of the invention to provide an engineering system for the setup, configuration and/or monitoring of an error-proof communication link between a first automation component and a second automation component. The automation components are located in an automation system of industrial control engineering, where it is also possible to transfer data structures over the communication link. Here, the data structures include different data types, and in accordance with the invention an association device that is configured to associate with each of the data types of a data structure that is associated with a set-up error-proof communication link a respective data-type-specific representative is provided, and configured to transfer this association to the first and second automation component as an item of association information, where, for the purpose of identifying data corruption in a data transfer over the error-proof communication link between the first automation component and the second automation component, these form a structure checksum by way of the representatives.

For the purpose of securing data structures in an error-proof communication, a structure checksum (e.g., CRC, hash) relating to the data structure is now formed on both sides and checked by the communication partners. Here, the structure checksum takes into account the data type and the sequence of data in the data structure. Here, a data type may be represented, for example, by numerical indicators, textual indicators (a representative indicator or indeed a data type indicator itself) or indeed alphanumerically. The relevant point here is that each data type can be referenced unambiguously. In order to calculate the structure checksum, mapping onto the representation is performed in the order in which the data types are set up in the link, and the checksum is formed from this.

Advantageously, once data corruption has been identified in an engineering system by way of the automation component, an entry in a diagnostic buffer is triggered. Preferably, the automation component, in the form of a PLC, enters the identified error in an error memory, and the engineering system can interrogate this.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawing illustrates an exemplary embodiment of the invention. In the drawing:

FIG. 1 shows a basic mapping table or association table, with data types and three examples of data structures;

DETAILED DESCRIPTION OF THE EXEMPLARY EMBODIMENTS

Figure 2:
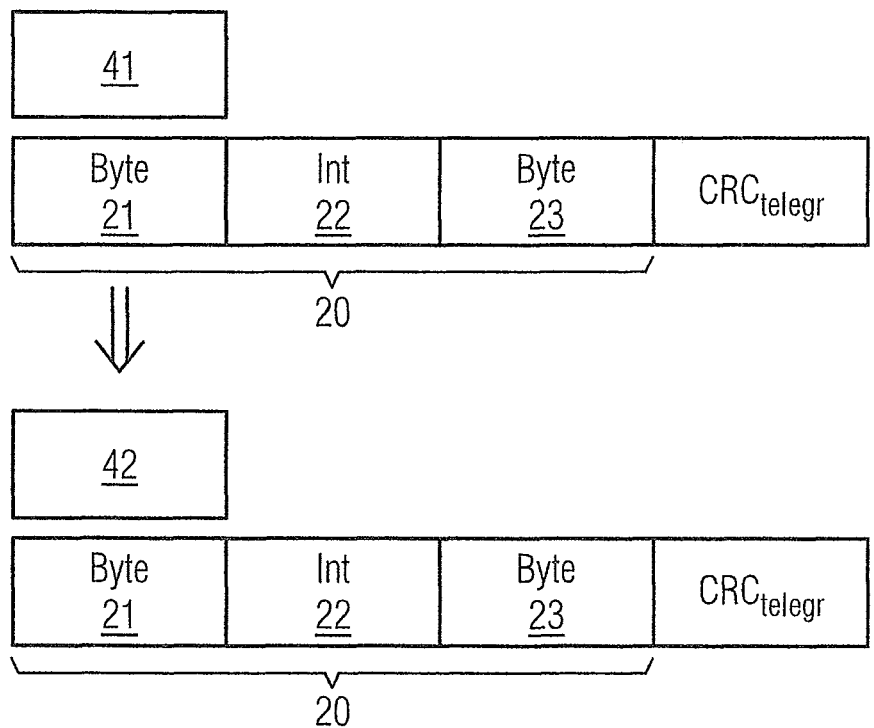
FIG. 2 shows a data transfer from a transmitter to a receiver in accordance with the prior art (without any errors)

FIG. 1 illustrates a mapping table for a data structure 20 with a first data type 21, a second data type 22, a third data type 23, a fourth data type 24 and a fifth data type 25. The data structure 20 accordingly includes five structural elements (Bool, Int, Dint, Word, DWord). Unambiguously associated with each of the data types 21, 22, 23, 24, 25 is a representative 30. The Bool data type has the representative 17, the Int data type has the representative 89, the Dint data type has the representative 47, the Word data type has the representative 91, and the DWord data type has the representative 50.

For example, the data structure A is composed of four data types, in the order Bool, Int, Bool, Int, and accordingly there are associated with the Bool data types the representatives 17 and with the Int data types the representatives 89. If the order of the representatives 17, 89, 17, 89 is used to form the checksum, then a specific checksum 0X11223344 is obtained for the data structure of example A.

The data structure B has data types in the order Int, Bool, Bool, Int, and accordingly has the representatives 89, 17, 17, 89; an exemplary checksum from the order of the representatives 89, 17, 17, 89 would give a checksum of 0X59425945.

Likewise, the data structure C has four data types, in this case the data types Int, Word, Dint, DWord, and accordingly the representatives 89, 91, 47, 50 are associated therewith, and an exemplary checksum of 0X9A693BF8 is obtained.

FIG. 2 illustrates a data transfer of a data structure 20 between a transmitter 41 and a receiver 42 in accordance with the prior art. A data structure 20 having three data types 21, 22, 23 is transferred. For the purpose of securing transfer, in accordance with the prior art a checksum $CRC_{telegr}$ is formed, spanning the entire telegram including the data structure 20. The telegram with the data structure 20 and the checksum $CRC_{telegr}$ is transferred to the receiver 42, and if transfer is valid it arrives as it was sent. The checksum $CRC_{telegr}$ was formed to span the telegram with a starting value that contains, for example, the address securing information, and if both the receiver and the transmitter interpret the data in the same way, then the possibility of a transfer error is ruled out.

Figure 3:
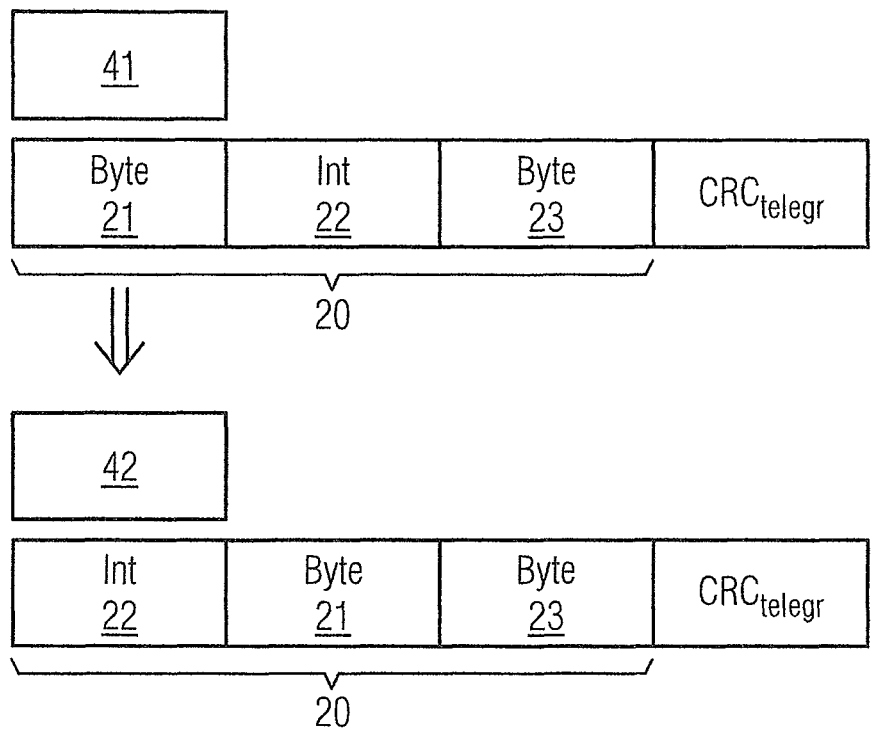
FIG. 3 shows a data transfer between a transmitter and a receiver in accordance with the prior art (with data corruption unidentified)

FIG. 3 illustrates a data transfer error in accordance with the prior art. Once again, the transmitter 41 transmits to the receiver 42 the data structure 20 already shown in FIG. 2. In this case, however, an error has crept in during the transfer from the transmitter 41 to the receiver 42, in that the order of the data types in the data structure 20 has been mixed up. However, in accordance with the prior art a checksum $CRC_{telegr}$ is still formed such that it spans the entire data structure. The result is that the receiver 42 and the transmitter 41 have an undiscovered different interpretation of the data in the data structure. However, the telegram is still considered to be a valid telegram by the receiver.

Figure 4:
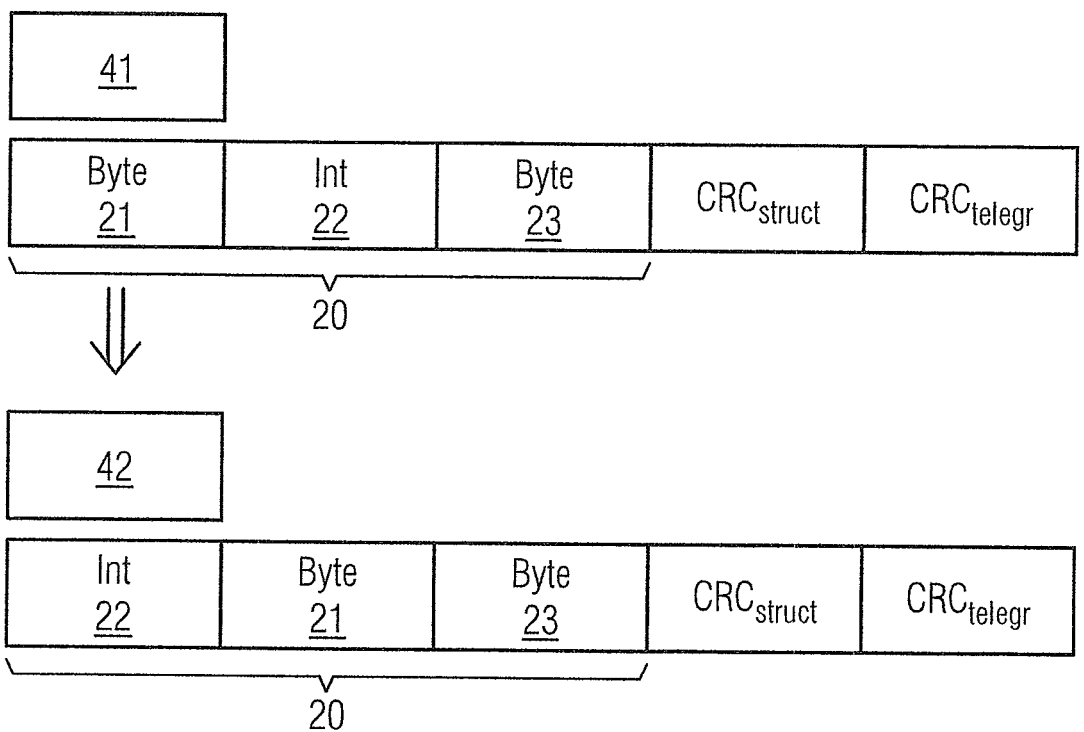
FIG. 4 shows a data transfer between a transmitter and a receiver, with an additional structure checksum relating to the data types of the data structure in accordance with the invention.

In accordance with the invention, in FIG. 4 an additional structure checksum $CRC_{struct}$ is now formed in relation to a data structure 20. The additional structure checksum $CRC_{struct}$ is formed by way of data-specific representatives 30 for the first data type 21, the second data type 22 and the third data type 23. Accordingly, the structure checksum $CRC_{struct}$ is formed using the numerical order 17, 89, 17. This means that before the checksum $CRC_{telegr}$ is formed for the telegram at the first automation component 11, a data-specific representative 30 is associated with the data types 21, 22, 23 in the data structure 20, and then the structure checksum $CRC_{struct}$ is formed using the representatives 30, and thereafter the data structure 20 is transferred with the structure checksum $CRC_{struct}$ formed using the representatives 30, where the normal checksum $CRC_{telegr}$ of the telegram is again additionally attached. Another possibility would also be for the checksum $CRC_{struct}$ of the data structure to be included as a starting value in the checksum $CRC_{telegr}$ of the telegram. Once this telegram arrives at the second automation component 12 or the receiver 42, then the data-type-specific representative 30 is once again associated with the data types 21, 22, 23 in the received data structure 20, and the structure checksum $CRC_{struct}$ is once again formed using the representatives 30. The transferred structure checksum $CRC_{struct}$ and the newly calculated structure checksum $CRC_{struct}$ are checked at the second automation component 12, i.e., at the receiver 42, and in the event of a discrepancy between the structure checksums, data corruption is identified.

In FIG. 4, the receiver 42 and the transmitter 41 have different data structures 20. As a result, the telegrams accordingly have different checksums $CRC_{struct}$ or different starting values, and the telegram is regarded as invalid by the receiver and hence data corruption is identified.

Figure 5:
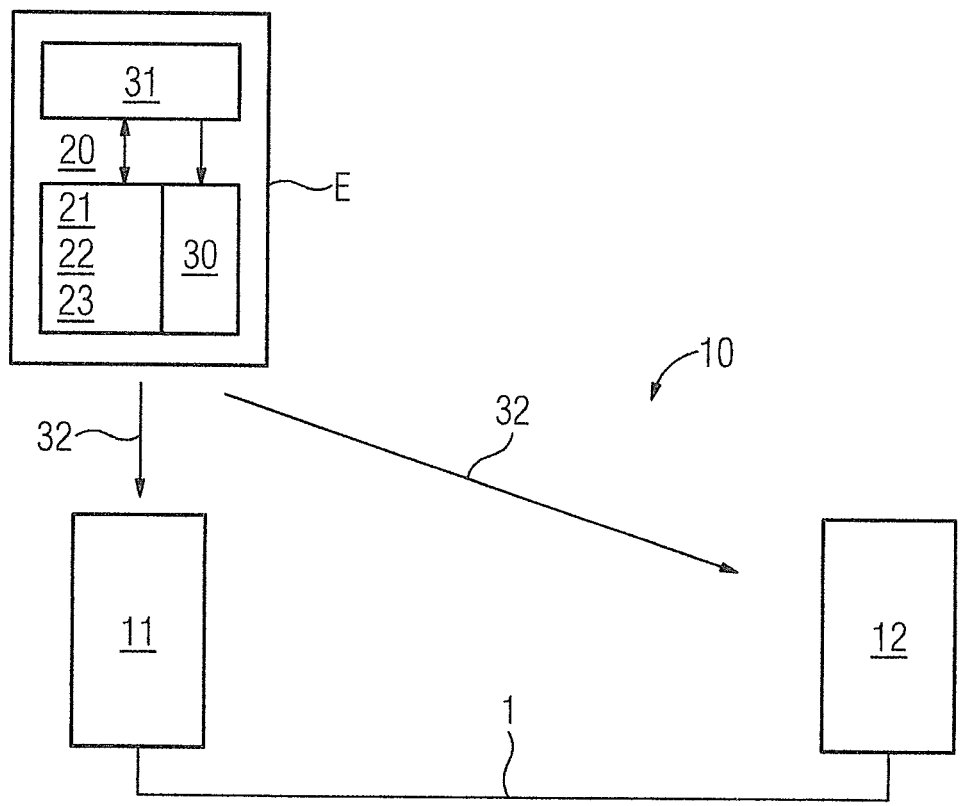
FIG. 5 shows an automation system having an error-proof communication link between two automation components in accordance with the invention.

FIG. 5 illustrates an engineering system E for the setup, configuration and/or monitoring of an error-proof communication link 1. The engineering system E has an association device 31 that can associate representatives 30 with the data types 21, 22, 23 of a data structure 20.

Using an association step of "recording" connection parameters 32, information on how the representatives 30 are associated with the data types 21, 22, 23 is stored in the automation system 10 in the first and second automation components 11, 12.

Figure 6:
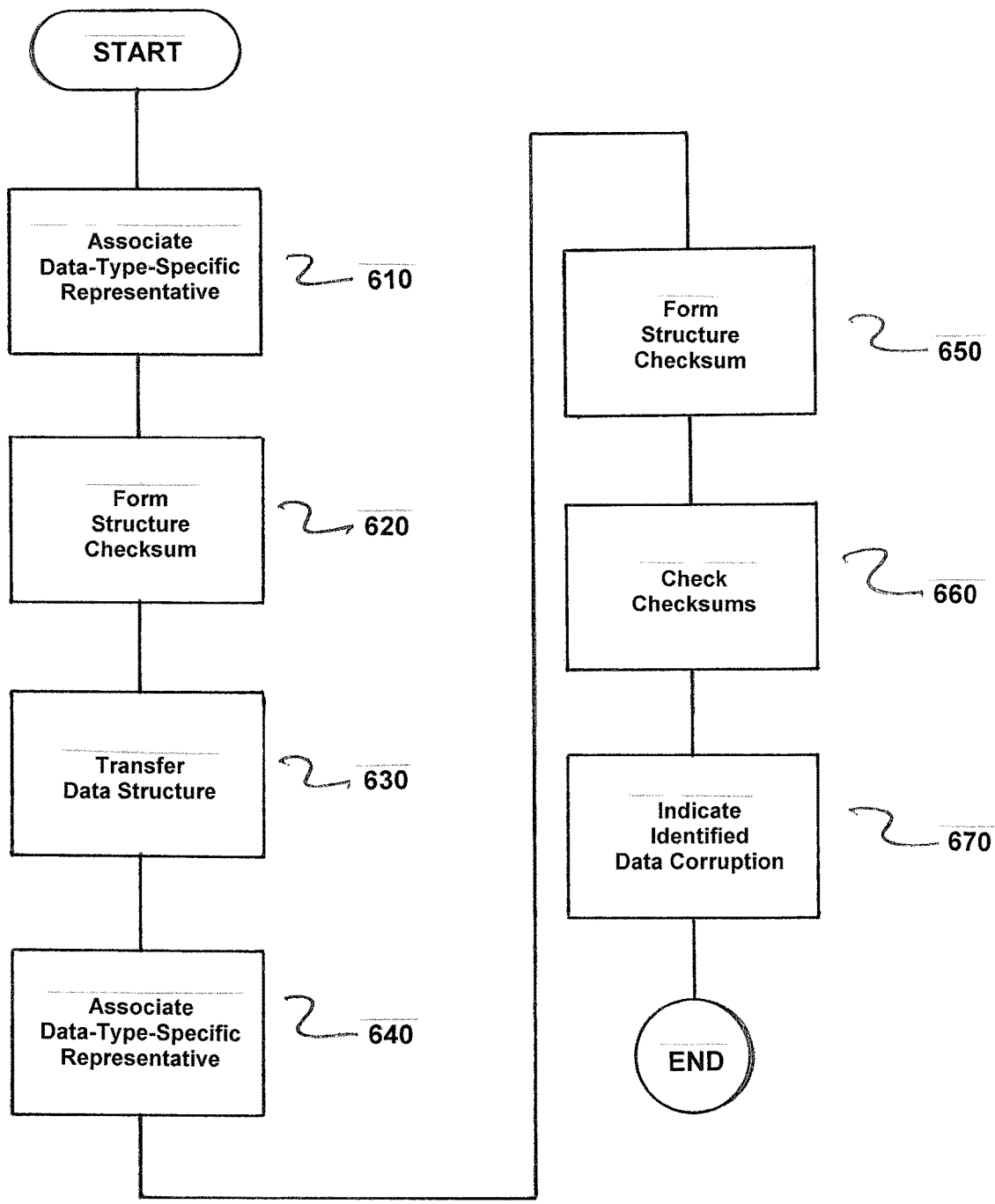
FIG. 6 is a flowchart of the method in accordance with the invention.

FIG. 6 is a flowchart of the method for identifying data corruption in a data transfer over an error-proof communication link 1 between a first automation component 11 and a second automation component 12 in industrial control engineering, during transfer of a data structure 20 a checksum $CRC_{telegr}$ regarding a telegram to be transferred being formed both at the first automation component 11 and at the second automation component 12 to secure the data structure 20 in the telegram to be transferred, and the data structure 20 includes different data types 21, 22, 23, 24, 25. The method comprises associating a data-type-specific representative 30 with the different data types 21, 22, 23, 24, 25 contained in the data structure 20 before the checksum $CRC_{telegr}$ for the telegram is formed at the first automation component 11, as indicated in step 610.

Next, a structure checksum $CRC_{struct}$ is formed via representatives 30, as indicated in step 620. The data structure 20 with the structure checksum $CRC_{struct}$ that is formed via the representatives 30 is now transferred, as indicated in step 630. Next, the data-type-specific representative 30 with the data types 21, 22, 23, 24, 25 in the received data structure 20 is associated in the second automation component 12, as indicated in step 640. Next, the structure checksum $CRC_{struct}$ is formed via the representatives 30, as indicated in step 650.

Next, the transferred structure checksum $CRC_{struct}$ and a newly calculated structure checksum $CRC_{struct}$ are checked at the second automation component 12, as indicated in step 660. Next, data corruption that has been identified in an event of a discrepancy between the transferred structure checksums $CRC_{struct}$ and the newly calculated structure checksum $CRC_{struct}$ are now identified, as indicated in step 670.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for identifying data corruption in a data transfer over an error-proof communication link between a first automation component and a second automation component in an automation system of industrial control engineering, a respective checksum regarding a telegram to be transferred being formed both at the first automation component and at the second automation component during transfer of a data structure to secure the data structure in the telegram to be transferred, and the data structure including different data types, the method comprising:
    associating a data-type-specific representative with the different data types contained in the data structure before the respective checksum at the first automation component for the telegram to be transferred is formed;
    forming a structure checksum via data-type-specific representatives;
    transferring the data structure with the structure checksum that is formed via the data-type-specific representatives;
    associating, in the second automation component, the data-type-specific representative with the data types in the received data structure;
    forming the structure checksum via the data-type-specific representatives;
    checking the transferred structure checksum and a newly calculated structure checksum at the second automation component; and
    indicating data corruption has been identified in an event of a discrepancy between the transferred structure checksums and the newly calculated structure checksum.

2. The method as claimed in claim 1, wherein, in the event of identification of data corruption, a data transfer error in the communication link is identified; wherein a secure condition is selected for the communication link; and wherein pre-projected substitute values are provided in the second automation component.

3. The method as claimed in claim 1, wherein, during data transfer, the structure checksum formed via the representatives is transferred in addition to the respective checksums formed for the telegram to be transferred.

4. The method as claimed in claim 2, wherein, during data transfer, the structure checksum formed via the representatives is transferred in addition to the respective checksums formed for the telegram to be transferred.

5. The method as claimed in claim 1, wherein one of (i) a numerical indicator, (ii) a textual indicator and (iii) the data type indicator is utilized as the representative.

6. The method as claimed in claim 2, wherein one of (i) a numerical indicator, (ii) a textual indicator and (iii) the data type indicator is utilized as the data-type-specific representative.

7. The method as claimed in claim 3, wherein one of (i) a numerical indicator, (ii) a textual indicator and (iii) the data type indicator is utilized as the data-type-specific representative.

8. The method as claimed in claim 1, wherein a security protocol is utilized to achieve data transfer.

9. An engineering system for at least one of setup, configuration and monitoring of an error-proof communication link between a first automation component and a second automation component in an automation system of industrial control engineering, a respective checksum regarding a telegram to be transferred being formed both at the first automation component and at the second automation component during transfer of a data structure to secure the data structure in the telegram to be transferred, data structures being transferable over the communication link, and the data structures including different data types, the engineering system comprising:
    an association device configured to associate with each of the data types of a data structure associated with a set-up error-proof communication link, a respective data-type-specific representative before the respective checksum at the first automation component for the telegram to be transferred is formed, and configured to transfer said association to the first and second automation components as an item of association information;

wherein a structure checksum is formed via the data-type-specific representatives to identify data corruption in a data transfer over the error-proof communication link between the first and second automation components.

10. The engineering system as claimed in claim 9, wherein the system triggers an entry in a diagnostic buffer if data corruption is identified by the first and second automation components.

* * * * *